(12) United States Patent
Fujii (10) Patent No.: US 10,186,634 B2
(45) Date of Patent: Jan. 22, 2019

(54) SEMICONDUCTOR LIGHT-EMITTING ELEMENT

(71) Applicant: STANLEY ELECTRIC CO., LTD., Meguro-ku, Tokyo (JP)

(72) Inventor: Yusaku Fujii, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/561,030

(22) PCT Filed: Mar. 4, 2016

(86) PCT No.: PCT/JP2016/056740
§ 371 (c)(1),
(2) Date: Sep. 22, 2017

(87) PCT Pub. No.: WO2016/152453
PCT Pub. Date: Sep. 29, 2016

(65) Prior Publication Data
US 2018/0062035 A1  Mar. 1, 2018

(30) Foreign Application Priority Data

Mar. 23, 2015  (JP) .................. 2015-059265

(51) Int. Cl.
*H01L 33/32* (2010.01)
*H01L 33/22* (2010.01)
(Continued)

(52) U.S. Cl.
CPC .......... *H01L 33/22* (2013.01); *H01L 33/0025* (2013.01); *H01L 33/06* (2013.01); *H01L 33/24* (2013.01); *H01L 33/32* (2013.01)

(58) Field of Classification Search
CPC .......... H01L 33/04; H01L 33/24; H01L 33/32
See application file for complete search history.

(56) References Cited

U.S. PATENT DOCUMENTS

| 7,190,001 B2 | 3/2007 | Taki |
| 2005/0056850 A1 | 3/2005 | Taki |

(Continued)

FOREIGN PATENT DOCUMENTS

| JP | 2005150631 A | 6/2005 |
| JP | 2008071805 A | 3/2008 |

(Continued)

OTHER PUBLICATIONS

International Search Report (ISR) and Written Opinion dated Aug. 2, 2016 issued in International Application No. PCT/JP2016/056740.

(Continued)

*Primary Examiner* — Kyoung Lee
*Assistant Examiner* — Christina Sylvia
(74) *Attorney, Agent, or Firm* — Holtz, Holtz & Volek PC (57) ABSTRACT

A semiconductor light-emitting element includes: a first semiconductor layer of a first conductivity type; a light-emitting functional layer including a light-emitting layer formed on the first semiconductor layer; and a second semiconductor layer that is of a conductivity type opposite to that of the first semiconductor layer and is formed on the light-emitting functional layer. The light-emitting layer has a base layer with a plurality of base segments that have a composition subject to stress strain from the first semiconductor layer and are formed in a random net shape, and a quantum well structure layer formed from at least one quantum well layer and at least one barrier layer that are formed on the base layer. Each of the at least one quantum well layer has an InGaN composition so that the In composition increases as the distance to the second semiconductor layer decreases.

11 Claims, 4 Drawing Sheets

(51) Int. Cl.
    *H01L 33/06*     (2010.01)
    *H01L 33/00*     (2010.01)
    *H01L 33/24*     (2010.01)

(56) References Cited

U.S. PATENT DOCUMENTS

| 2009/0212278 | A1* | 8/2009 | Jorgenson | H01L 33/105 |
| | | | | 257/13 |
| 2012/0012814 | A1* | 1/2012 | Harada | H01L 21/02458 |
| | | | | 257/13 |

FOREIGN PATENT DOCUMENTS

| JP | 2011249460 A | 12/2011 |
| JP | 2013084978 A | 5/2013 |

OTHER PUBLICATIONS

Extended European Search Report (EESR) dated Aug. 28, 2018 issued in counterpart European Application No. 16768356.4.

Moll, et al., "The influence of sruface stress on the equilibrium shape of strained quantum dots", arxiv.org, Cornell University Library, 201 OLIN Library Cornell University Ithaca, NY 14853, Jul. 14, 1998.

Tersoff, et al., "Competing relaxation mechanisms in strained layers", Physical Review Letters, May 30, 1994, vol. 72, No. 22, pp. 3570-3573.

\* cited by examiner

SEMICONDUCTOR LIGHT-EMITTING ELEMENT

TECHNICAL FIELD

The present invention relates to a semiconductor light-emitting element, such as a light-emitting diode (LED).

BACKGROUND ART

A semiconductor light-emitting element is usually produced by growing, on a growth substrate, a semiconductor structure layer formed from an n-type semiconductor layer, an active layer, and a p-type semiconductor layer and forming an n-type electrode and a p-type electrode that apply voltage to the n-type semiconductor layer and the p-type semiconductor layer, respectively.

Patent Literature 1 discloses a light-emitting device produced by forming at least two types of semiconductor light-emitting elements on one substrate material and applying, to each semiconductor light-emitting element, a plurality of types of phosphors that react to the light-emitting wavelengths of the respective semiconductor light-emitting elements. Patent Literature 2 discloses a white light-emitting diode in which red, green, and blue light-emitting diodes are laminated in this order in order to emit light in the same direction.

CITATION LIST

Patent Literature

Patent Literature 1: Japanese Patent Application Laid-Open No. 2008-071805
Patent Literature 2: Japanese Patent Application Laid-Open No. 2011-249460

SUMMARY OF INVENTION

Technical Problem

Emission of light by a semiconductor light-emitting element is induced by, in the active layer, binding (recombination) of an electron and hole injected into the element through electrodes. The wavelength of the light emitted from the active layer (i.e., emitted light color) is determined by the band gap of the semiconductor material that constitutes the active layer. For example, a light-emitting element using a nitride-based semiconductor emits blue light from its active layer.

A light source is eventually required to have color rendering properties for, for example, lighting applications. A light source with high color rendering properties is a type of light source that emits near natural light. To achieve high color rendering properties, it is preferable that light whose wavelength substantially covers the entire wavelength of the visible region be extracted from the light source. For example, light extracted from a light source with high color rendering properties is observed as white light.

To cope with this, as disclosed in the aforementioned patent literature, various techniques of using a semiconductor light-emitting element to acquire white light have been proposed. In a proposed example technique, by laminating a plurality of active layers with different compositions, the light-emitting wavelength bandwidth is widened without using a phosphor. Also, in another proposed technique, a layer having an uneven structure is inserted between an active layer and an n-type semiconductor layer to thereby make the band gap uneven in the active layer and broaden the light-emitting wavelength bandwidth.

However, a light-emitting apparatus manufactured using the aforementioned techniques has problems in terms of the uniformity of emitted light colors, the complexity of the manufacturing process, and light-emitting intensity. Example problems include addition of a step of forming a semiconductor layer and a step of processing a semiconductor layer as well as degradation of the crystallinity of the semiconductor layer.

The present invention has been made in view of the aforementioned problems. An object of the present invention is to provide a semiconductor light-emitting element having high color rendering properties with a broad light-emitting wavelength bandwidth (spectral width) and a high light-emission intensity.

Solution to Problem

The semiconductor light-emitting element according to the present invention includes: a first semiconductor layer of a first conductivity type; a light-emitting functional layer including a light-emitting layer formed on the first semiconductor layer; and a second semiconductor layer that is formed on the light-emitting functional layer and is of a conductivity type opposite to that of the first semiconductor layer. The light-emitting layer has a base layer with a plurality of base segments that have a composition subject to stress strain from the first semiconductor layer and are formed in a random net shape, and a quantum well structure layer formed from at least one quantum well layer and at least one barrier layer that are formed on the base layer. Each of the at least one quantum well layer has an InGaN composition and is configured to increase an In composition thereof as a distance to the second semiconductor layer decreases.

DESCRIPTION OF EMBODIMENTS

Embodiments of the present invention will be hereinbelow described in detail. In this specification, an identical reference numeral is assigned to an identical constituent element.

First Embodiment

Figure 1A:
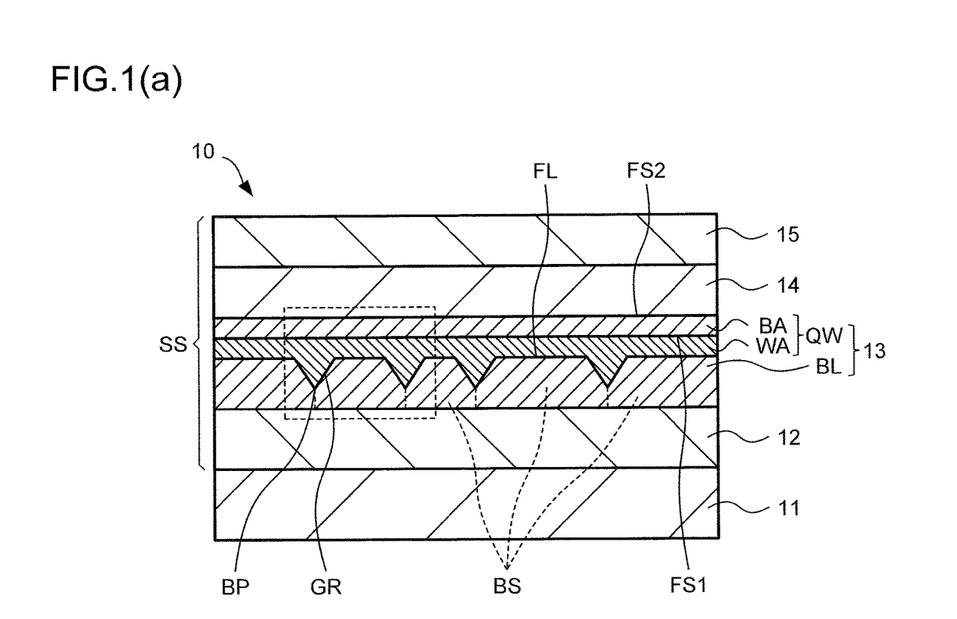
FIG. 1(a) is a cross-sectional view illustrating a structure of a semiconductor light-emitting element according to a first embodiment.

FIG. 1(a) is a cross-sectional view illustrating a structure of a semiconductor light-emitting element (hereinafter may be simply referred to as a light-emitting element or element) 10 according to a first embodiment. In the structure of the semiconductor light-emitting element 10, a semiconductor structure layer SS is formed on a mounting substrate (hereinafter may be simply referred to as a board) 11. The semiconductor structure layer SS includes: an n-type semiconductor layer (first semiconductor layer) 12 formed on the mounting substrate 11; a light-emitting functional layer 13 including a light-emitting layer formed on the n-type semiconductor layer 12; an electron blocking layer 14 formed on the light-emitting functional layer 13; and a p-type semiconductor layer (second semiconductor layer whose conductivity type is opposite to the conductivity type of the first semiconductor layer) 15 formed on the electron blocking layer 14.

In this embodiment, the mounting substrate 11 is, for example, a growth substrate that is used for growth of the semiconductor structure layer SS and is formed from, for example, sapphire. In addition, the semiconductor structure layer SS is formed from a nitride-based semiconductor. The semiconductor light-emitting element 10 can be manufactured by growing the semiconductor structure layer SS on the sapphire substrate, whose C surface serves as a crystal growth surface, using a Metal Organic Chemical Vapor Deposition (MOCVD) method. Although not illustrated in the drawings, the light-emitting element 10 has an n-electrode and a p-electrode that apply voltage to the n-type semiconductor layer 12 and the p-type semiconductor layer 15, respectively.

The embodiment will be described with reference to the case in which the light-emitting element 10 has a structure in which the semiconductor structure layer SS is formed on the growth substrate as the mounting substrate 11. However, this embodiment is not limited to the case in which the mounting substrate 11 serves as a growth substrate. For example, the semiconductor light-emitting element 10 may have a structure obtained by bonding the semiconductor structure layer SS, which is first formed on a growth substrate, onto another substrate (support substrate) and removing the growth substrate. In this case, the other bonded substrate is provided on the p-type semiconductor layer 15. The aforementioned substrate to be bonded can use a material with a high degree of heat dissipation, for example, Si, AlN, Mo, W, or CuW.

Although not illustrated in the drawings, a buffer layer (underlayer) may be provided between the mounting substrate 11 and the n-type semiconductor layer 12. The buffer layer is provided to, for example, mitigate the strain generated in the interface between the growth substrate and the semiconductor structure layer SS as well as in the interface between respective layers of the semiconductor structure layer SS. In this embodiment, after growth of an undoped GaN layer on the sapphire substrate (mounting substrate 11) as a buffer layer, the n-type semiconductor layer 12 was laminated.

The n-type semiconductor layer 12 is formed from, for example, a GaN layer including an n-type dopant (for example, Si). The electron blocking layer 14 is formed from, for example, an AlGaN layer. The p-type semiconductor layer 15 is formed from, for example, a GaN layer containing a p-type dopant (for example, Mg). Also, the electron blocking layer 14 may contain a p-type dopant. In addition, the p-type semiconductor layer 15 may have a contact layer on the principal surface opposite from the interface with the electron blocking layer 14.

The light-emitting functional layer 13 may have a plurality of light-emitting layers. However, this embodiment will be described with reference to the case in which the light-emitting layer 13 is formed from one light-emitting layer. The light-emitting layer 13 is formed on the n-type semiconductor layer 12 and has a quantum well (QW) structure.

The light-emitting layer 13 has a base layer BL whose composition differs from that of the n-type semiconductor layer 12. The base layer BL has a groove GR formed to have a random net shape due to stress strain from the n-type semiconductor layer 12. Specifically, the groove GR has a mesh shape formed by a plurality of combined grooves created by the stress strain, which is generated in the base layer BL due to the composition difference between the n-type semiconductor layer 12 and the base layer BL. The stress strain generated in the base layer BL is strain of the crystal structure of the base layer BL caused by the lattice constant difference between the n-type semiconductor layer 12 and the base layer BL.

The light-emitting layer 13 has a quantum well structure layer QW formed from a quantum well layer WA and a barrier layer BA that are formed on the base layer BL. The quantum well layer WA is formed on the base layer BL, and the barrier layer BA is formed on the quantum well layer WA. The base layer BL functions as a barrier layer for the quantum well layer WA.

Figure 1B:
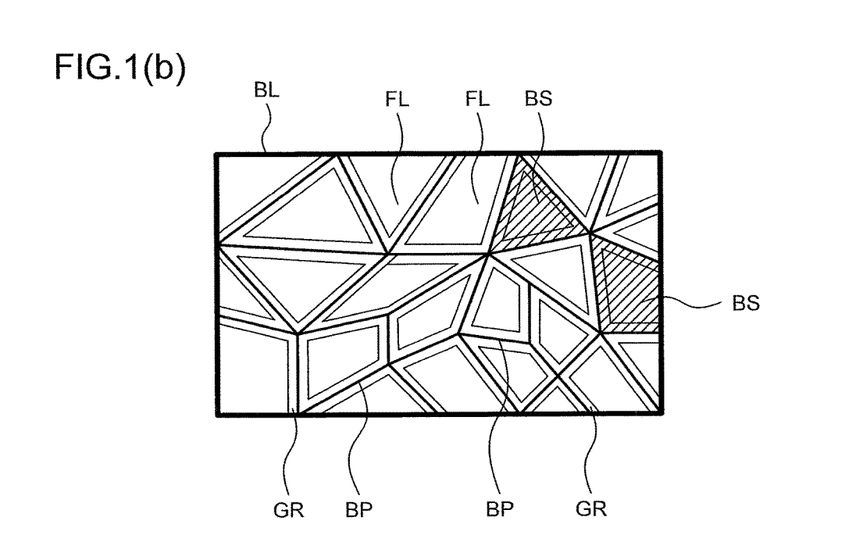
FIG. 1(b) is a top plan view schematically illustrating a base layer of a light-emitting layer.

Hereinbelow, the base layer BL will be described with reference to FIG. 1(b). FIG. 1(b) is a schematic view illustrating the upper surface of the base layer BL. The base layer BL has many fine base segments BS that are partitioned by the groove GR and formed to have random sizes. The base segments BS are defined to have a random net shape since the base layer has a composition subject to stress strain by the n-type semiconductor layer 12.

The groove GR is constituted of groove portions with random and different lengths and shapes. The groove GR is formed in a net (mesh) shape all over the surface of the base layer BL. Each base segment BS is a portion (segment) that is formed by random division of the base layer BL by the groove GR. The upper surfaces of the base segments BS respectively have various shapes, such as substantially round and oval shapes and a polygonal shape.

As illustrated in FIG. 1(a), the groove GR is, for example, V-shaped and has a line-like bottom portion BP. In this embodiment, an end portion of each base segment BS is the bottom portion BP of the groove GR. Each base segment BS adjoins another base segment BS at the bottom portion BP.

The base layer BL has a flattened portion FL corresponding to each base segment BS. The surface of the base layer BL is constituted of the flattened portion FL and the inner wall surface of the groove GR. Each flattened portion FL is defined by the groove GR for each base segment BS. The base segment BS has an upper surface formed from the flattened portion FL and side surfaces formed from the inner wall surfaces of the groove GR.

Specifically, the flattened portion FL constitutes an upper surface of each base segment BS, and the inner wall surface of the groove GR constitutes a side surface of the base segment BS. Accordingly, each base segment BS has an inclined side surface and a cross-sectional shape of, for example, substantially trapezoid.

The light-emitting layer 13 has the quantum well layer WA formed on the base layer BL. The quantum well layer WA is formed to bury the groove GR. Further, the upper surface of the quantum well layer WA is formed as a flattened surface (hereinafter referred to as a first flattened surface) FS1. At the interface (lower surface) with the base layer BL, the quantum well layer WA has an uneven shape corresponding to the groove GR. The upper surface of the quantum well layer WA is flattened. As illustrated in FIG. 1(a), the quantum well layer WA buries the base layer BL and thus has the first flattened surface FS1. The quantum well layer WA is formed as a strained quantum well layer.

Further, the light-emitting layer 13 has the barrier layer BA formed on the quantum well layer WA. Both of the principal surfaces of the barrier layer BA are formed as flattened surfaces. Specifically, the barrier layer BA is formed on the first flattened surface FS1 of the quantum well layer WA, and the upper surface of the barrier layer BA is formed as a flattened surface (hereinafter referred to as a second flattened surface) FS2.

Figure 2A:
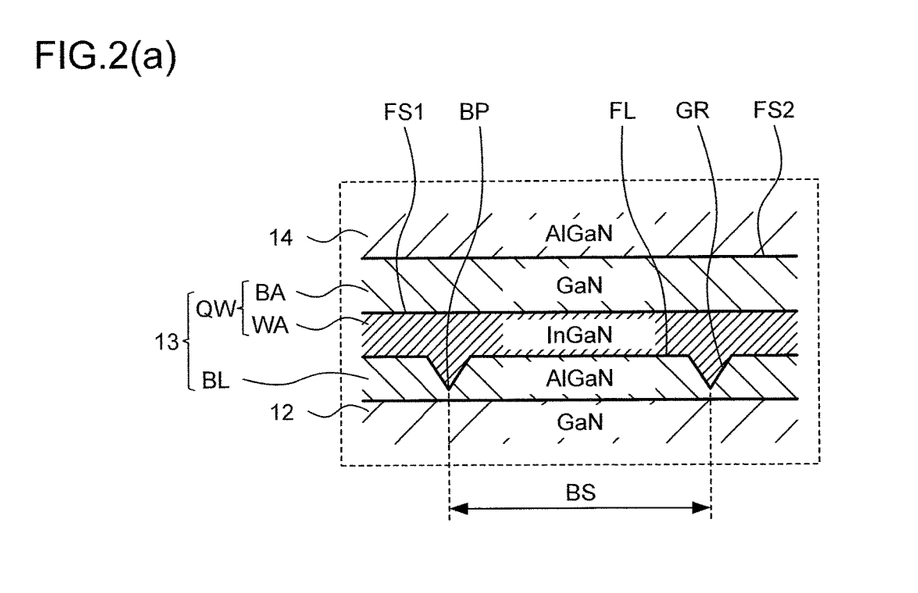
FIG. 2(a) is a cross-sectional view illustrating the structure of the light-emitting layer of the semiconductor light-emitting element according to the first embodiment.

FIG. 2(a) is a cross-sectional view illustrating the structure of the light-emitting layer 13. FIG. 2(a) is a partially enlarged cross-sectional view illustrating the portion of FIG. 1(a) surrounded by the dashed line with the portion being enlarged. The light-emitting layer 13 will be hereinbelow described more specifically with reference to FIG. 2(a). The base layer BL has, for example, an AlGaN or AlN composition. In the base layer BL, the base segment BS can be formed by growing an AlGaN or AlN layer as the base layer BL on a GaN layer as the n-type semiconductor layer 12 at a relatively low growth temperature.

When the base layer BL different from the aforementioned base layer BL in terms of crystal composition is grown in the n-type semiconductor layer 12, stress (strain) is generated on the base layer BL. For example, the base layer BL has a smaller lattice constant than that of the n-type semiconductor layer 12. For example, when an AlGaN layer as the base layer BL is allowed to be grown on a GaN layer as the n-type semiconductor layer 12, tensile strain is generated in the AlGaN layer due to the GaN layer. Therefore, tensile stress is generated in the AlGaN layer during its growth. Accordingly, a groove is formed in the AlGaN layer at the beginning of or during growth of the AlGaN layer, and the AlGaN layer grows in a three-dimensional manner thereafter. Specifically, the AlGaN layer is grown in a stereoscopic manner thereafter, and a plurality of fine protrusions and recesses are formed. The starting point of this groove formation is the bottom portion BP of the groove GR.

When the AlGaN layer is grown at a low temperature on the GaN layer, growth of the AlGaN layer in a three-dimension manner thereafter is promoted. Accordingly, a very large number of grooves (groove GR) are combined with each other and formed on the surface of the AlGaN layer, whereby the surface of the AlGaN layer is defined as a plurality of grain-like segments. The base layer BL with the base segment BS can thus be formed. In this embodiment, the AlGaN layer as the base layer BL was formed at a growth temperature of 1100° C.

When an InGaN layer as the quantum well layer WA is formed on the base layer BL, the quantum well layer WA is formed as a strained quantum well layer. Also, the In content distribution differs depending on the region of the quantum well layer WA. Specifically, the quantum well layer WA is formed such that, for example, the region on the flattened portion FL differs from the region on the groove GR in terms of In composition. In addition, the layer thickness of the quantum well layer WA on the upper surface of the base segment BS differs from that on the side surface of the base segment BS. Thus, the band gap is not constant within the quantum well layer WA. As the light-emitting layer 13 has fine island-shaped protrusions and recesses, the light-emitting layer 13 emits various colors of light.

Also, as the size of the base segment BS decreases, the amount of In introduced into the base layer BL increases, and the light-emitting wavelength shifts toward the longer wavelength side. In addition, when an InGaN layer as the quantum well layer WA is formed on an AlGaN layer as the base layer BL, the InGaN layer is subject to compressive strain by the AlGaN layer. When the InGaN layer is subject to compressive strain, In is readily introduced into the quantum well layer WA. Thereby, the band gap of the InGaN layer, in other words, the energy between quantum levels, decreases. The quantum well layer WA emits light with a light-emitting wavelength on the longer wavelength side.

Figure 2B:
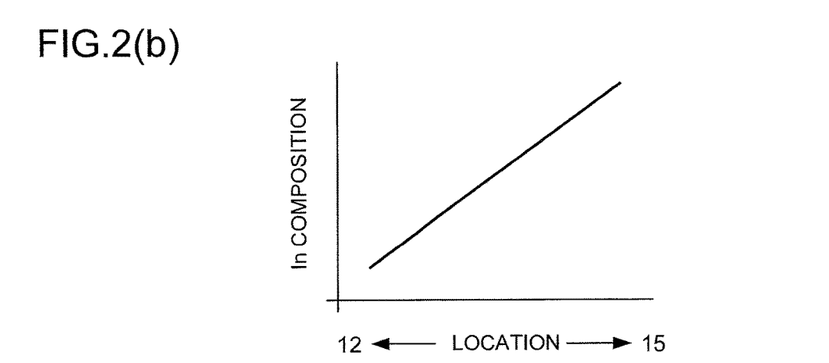
FIG. 2(b) is a view illustrating the In composition distribution in a quantum well layer.

FIG. 2(b) is a view illustrating the distribution of the In composition of the quantum well layer WA. The horizontal axis of FIG. 2(b) represents the location in the lamination direction (growth direction) of the quantum well layer WA, and the vertical axis thereof represents the In composition. As illustrated in FIG. 2(b), the quantum well layer WA is formed so that the In composition increases as the distance to the p-type semiconductor layer 15 decreases. Specifically, the In composition of the InGaN layer as the quantum well layer WA is small on the side close to the n-type semiconductor layer 12 and large on the side close to the p-type semiconductor layer 15.

In this embodiment, the quantum well layer WA is configured so that the In composition continuously increases in the lamination direction of the semiconductor structure layer SS as the distance to the p-type semiconductor layer 15 decreases. The quantum well layer WA can be formed by continuously increasing the supply amount of In supply gas, such as trimethylindium (TMI), for growth of the quantum well layer WA. In this embodiment, the In composition of the quantum well layer WA was gradually increased (changed) from 3% to 30%.

By forming the quantum well layer WA so that the In composition changes in the growth direction, the strain within the quantum well layer WA is mitigated as the distance to the p-type semiconductor layer 15 decreases. Specifically, the crystal structure of the quantum well layer WA at the interface with the base layer BL is strained by the base layer BL, and thereafter formation of the quantum well layer WA continues for a certain period of time while following the groove GR on the surface of the base layer BL. However, after the growth progresses to a certain extent, the strain is mitigated by further increasing the In composition. Therefore, the quantum well layer WA is formed so that the groove GR of the base layer BL is buried. Thereby, the crystallinity of the quantum well layer WA increases and thus the light-emitting efficiency increases. Also, in this embodiment, the base segment BS of the base layer BL has the flattened portion FL. Accordingly, the upper surface of the quantum well layer WA is the flattened portion FS1. Therefore, the crystallinity of the upper surface of the quantum well layer WA is ensured at a preferable level, and the light-emitting efficiency is improved.

In this embodiment, the light-emitting layer 13 emits light with an intensity peak in a region on the longer wavelength side than the blue region. In a specific example where the layer thickness of the base layer BL was 7 nm, broad spectral-width light with a spectral intensity peak at approximately 530 nm was emitted. The size of the base segment BS in the in-plane direction ranged from several tens of nm to several μm.

Figure 3:
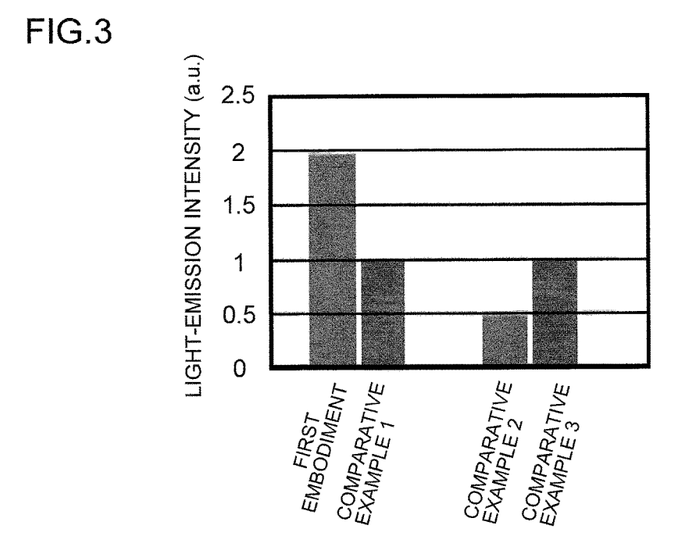
FIG. 3 is a view illustrating the peak intensity of the light emission spectrum of the semiconductor light-emitting element according to the first embodiment.

FIG. 3 is a view illustrating the light-emitting intensity peak of the light-emitting element 10. The vertical axis of the figure represents the light-emitting intensity of the light-emitting element 10 (first embodiment) and three comparative examples with other structures. As Comparative Example 1, a light-emitting element with a quantum well layer whose In composition was constant was produced. Also, as Comparative Example 2, a light-emitting element that did not have the base layer BL was produced. This light-emitting element of Comparative Example 2 had a light-emitting layer in which a quantum well layer with a certain In composition distribution was interposed between barrier layers WB. In addition, as Comparative Example 3, a light-emitting element that did not have a base layer was produced. This light-emitting element of Comparative Example 3 had a light-emitting layer in which a quantum well layer with a constant In composition was interposed between the barrier layers WB. In Comparative Examples 2 and 3, the quantum well layer has a flattened principal surface.

As illustrated in FIG. 3, the light-emitting intensity of the light-emitting element 10 was twice greater than that of the quantum well layer with a constant In composition (Comparative Example 1). Specifically, the light-emitting intensity was significantly increased. Regarding those without the base layer BL (Comparative Examples 2 and 3), the one in which the In composition of the quantum well layer increased as the distance to the p-type semiconductor layer 15 decreased (Comparative Example 2) was lower than the one in which the In composition of the quantum well layer was constant (Comparative Example 3) in terms of light-emitting intensity.

In other words, the configuration where the In composition of the quantum well layer increases as the distance to the p-type semiconductor layer 15 decreases is effective when the quantum well layer is formed on the base layer BL. However, this configuration is not effective when the quantum well layer is simply flattened. A conceivable cause for a decrease in the light-emitting intensity due to the In composition distribution as in Comparative Examples 2 and 3 is a deviation between the wave functions of the electron and hole.

These embodiments are described with reference to the case in which the base layer BL is formed from the flattened portion FL and the groove GR. However, the surface shape of the base layer BL is not limited to the aforementioned case. For example, the upper surface of the base segment BS may have a curved shape.

This embodiment is described with reference to the case in which the quantum well structure layer QW has a structure including one quantum well layer WA and one barrier layer BA. However, the embodiment is not limited to the aforementioned case. Specifically, the quantum well structure layer QW may be constituted of a plurality of the quantum well layers WA and a plurality of the barrier layers BA. Specifically, the quantum well structure layer QW may have a single quantum well (SQW) structure or a multi-quantum well (MQW) structure. Specifically, the quantum well structure layer QW should be constituted of at least one quantum well layer WA and at least one barrier layer BA that are formed on the base layer BL.

Figure 4:
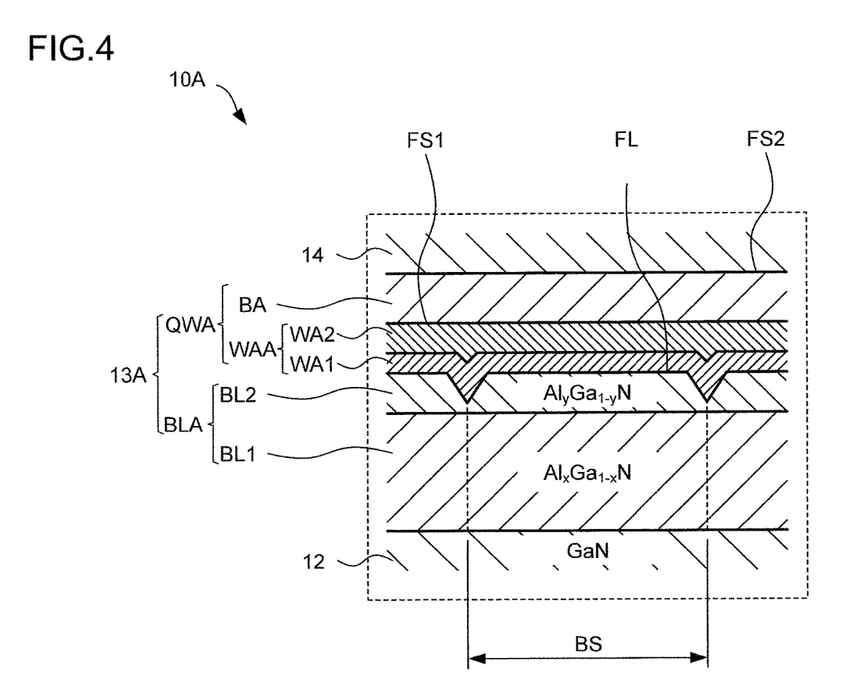
FIG. 4 is a cross-sectional view illustrating a structure of a light-emitting layer of a semiconductor light-emitting element according to a first modified example of the first embodiment.

FIG. 4 is a cross-sectional view illustrating a structure of a semiconductor light-emitting element 10A according to a first modified example of the first embodiment. Except for the structure of a light-emitting functional layer (light-emitting layer) 13A, the configuration of the light-emitting element 10A is the same as that of the light-emitting element 10. A quantum well structure layer QWA of the light-emitting layer 13A is formed from a quantum well layer WAA and a barrier layer BA whose In compositions are different. In this modified example, at least one quantum well layer WAA and at least one barrier layer BA should be formed.

The quantum well layer WAA includes: a first layer WA1 that has an InGaN composition; and a second layer WA2 that is formed on the first layer WA1, has an InGaN composition, and has a greater In composition than that of the first layer WA1. Specifically, the quantum well layer WAA has a plurality of the layers WA1 and WA2 whose In compositions increase as the distance to the p-type semiconductor layer 15 decreases. Specifically, the quantum well layer WAA is configured so that the In composition increases in a stepwise manner as the distance to the p-type semiconductor layer 15 decreases.

The first embodiment is described with reference to the case in which the In composition in the quantum well layer WA continuously increases as the distance to the p-type semiconductor layer 15 decreases. However, as in the case of the quantum well layer WAA of this modified example, a plurality of layers (the first layer WA1 and the second layer WA2 in this modified example) may be formed so that the In composition changes in a stepwise manner for each layer. In this modified example, the quantum well layer WAA can be readily formed. Specifically, compared with the case in which the In composition continuously changes, the manufacturing error by a manufacturing apparatus is small in this case. Therefore, the quantum well layer WAA with a desired In composition can be stably and reliably formed. In consideration of the crystallinity of the quantum well layer, it is preferable that the In composition continuously change within the layer as in the case of the first embodiment.

Also, a base layer BLA of the light-emitting layer 13A has a first sub-base layer BL1 with the composition of $Al_xGa_{1-x}N$ ($0<x\leq1$) and a second sub-base layer BL2 with the composition of $Al_yGa_{1-y}N$ ($0<y\leq1$) formed on the first sub-base layer BL1. The base layer BLA has a plurality of sub-base layers comprising a plurality of AlGaN layers with different Al compositions. The barrier layer BA has a GaN composition.

Among a plurality of the sub-base layers BL1 and BL2 of the base layer BLA, the second sub-base layer BL2 has an Al composition y greater than that of the first sub-base layers BL1. Specifically, the Al composition y of the second sub-base layer BL2 is greater than the Al composition x of the first sub-base layer BL1. In this embodiment, Al composition y satisfies y=1. Specifically, in this embodiment, the first sub-base layer BL1 has an AlGaN composition, and the second sub-base layer BL2 has an AlN composition.

The base layer BL has the first sub-base layer BL1 and the second sub-base layer BL2 formed from AlGaN with different Al compositions. Also, the second sub-base layer BL2 is formed closer to the p-type semiconductor layer 15 than the first sub-base layer BL1 is and has a greater Al composition than that of the first sub-base layer BL1. Therefore, the first sub-base layer BL1 with a relatively small Al composition maintains the crystallinity between the n-type semiconductor layer 12 and the base layer BL. Also, due to the second sub-base layer BL2 with a relatively large Al composition, the band gap of the quantum well layer WA is distorted, and the spectral width is broadened. Thus, the light-emitting layer 13 emits light that has both a wide light-emitting wavelength bandwidth and a high light-emission intensity. Therefore, the light-emitting element 10A emits light with high color rendering proprieties and a high level of light-emitting intensity.

To address formation of the groove GR, an AlN layer (specifically, the second sub-base layer BL2) should be formed directly on the GaN layer. However, due to its large band gap, AlN inhibits migration of a carrier (electron) from the n-type semiconductor layer (GaN layer) 12 to the quantum well layer WA. The AlGaN layer (first sub-base layer BL1) can reduce inhibition of carrier migration as the band gap of the AlGaN layer is in between those of the AlN and GaN layers. Accordingly, a decrease in the light-emitting intensity can be suppressed.

In this modified example, the layer thickness of the first sub-base layer BL1 is, for example, 6 nm. Also, the layer thickness of the second sub-base layer BL2 is, for example, 1 nm.

Figure 5:
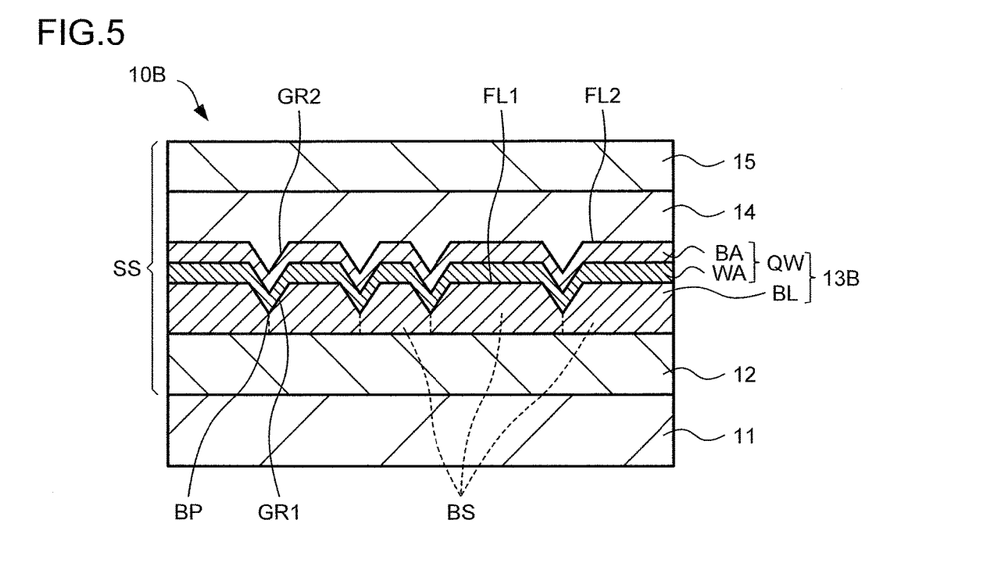
FIG. 5 is a cross-sectional view illustrating a structure of a semiconductor light-emitting element according to a second modified example of the first embodiment.

FIG. 5 is a cross-sectional view illustrating a structure of a semiconductor light-emitting element 10B according to a second modified example of the first embodiment. Except for the structure of a light-emitting layer 13B, the configuration of the semiconductor light-emitting element 10A is the same as that of the semiconductor light-emitting element 10.

In the semiconductor light-emitting element 10 illustrated in the first embodiment, the upper surface of the light-emitting layer 13 is completely flattened. More specifically, the quantum well layer WA and the barrier layer BA are formed to completely bury the groove GR of the base layer BL. The upper surfaces of the quantum well layer WA and the barrier layer BA are formed as the first flattened surface FS1 and the second flattened surface FS2, respectively. As illustrated in FIG. 5, in the semiconductor light-emitting element 10B of this modified example, the upper surface of the light-emitting layer 13B has a groove GR2 which follows the groove GR1 (corresponding to the groove GR of the light-emitting layer 13) of the base layer BL, Specifically, the region of the upper surface of the light-emitting layer 13B directly above the flattened portion FL1 is formed as the flattened portion FL2, and a recess portion (groove GR2) is formed at the location directly above the groove GR1.

In this modified example, the quantum well layer WA and the barrier layer BA do not completely bury the base segment BS. In this manner, by increasing the In composition as the distance to the p-type semiconductor layer 15 decreases, light with high color rendering proprieties and a high level of light-emitting intensity can be emitted from the quantum well layer WA with an upper surface of an uneven structure. Specifically, the quantum well layer WA and the barrier layer BA may be formed on the base layer BL.

Second Embodiment

Figure 6:
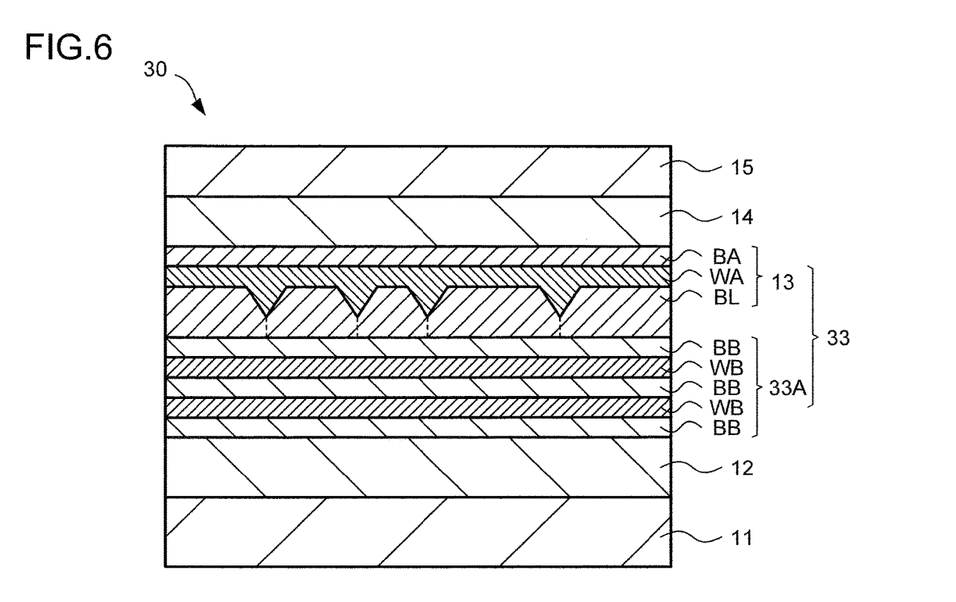
FIG. 6 is a cross-sectional view illustrating a structure of a semiconductor light-emitting element according to a second embodiment.

FIG. 6 is a cross-sectional view illustrating a structure of a semiconductor light-emitting element 30 according to a second embodiment. Except for the configuration of a light-emitting functional layer 33, the configuration of the light-emitting element 30 is the same as that of the light-emitting element 10. Between the n-type semiconductor layer 12 and the light-emitting layer (first light-emitting layer) 13, the light-emitting functional layer 33 has a light-emitting functional layer (second light-emitting layer) 33A that is formed from at least one (two in this embodiment) uniformly flattened quantum well layer WB and at least one (two in this embodiment) barrier layer WB and has a quantum well structure where the quantum well layer WB and the flattened barrier layer WB are alternately laminated.

In this embodiment, the light-emitting layer 33A has a multi-quantum well (MQW) structure in which each of two quantum well layers WB is interposed between two of three barrier layers BB on the n-type semiconductor layer 12. On the barrier layer BB that is located closest to the p-type semiconductor layer 15, the light-emitting layer 13 (base layer BL) is formed. Each quantum well layer WB has, for example, the same composition as that of the quantum well layer WA, for example, an InGaN composition. Each barrier layer BB has, for example, the same composition as that of the barrier layer BA, for example, a GaN composition. Of all the barrier layers BB, the barrier layer BB located closest to the light-emitting layer 13 has the same composition as that of the n-type semiconductor layer 12.

In this embodiment, the second light-emitting layer 33A of a quantum well structure is added to the side of the n-type semiconductor layer 12 of the light-emitting layer 13 in the light-emitting element 10 of the first embodiment. Therefore, compared with the first embodiment, additional light with a light-emitting wavelength in a pure blue region can be emitted. The configuration of this embodiment is advantageous for, for example, increasing the light intensity in the blue region. Specifically, in this embodiment, the light-emitting functional layer 33 has, between the n-type semiconductor layer 12 and the light-emitting layer 13, the quantum well layer WB that emits light whose wavelength is shorter than that of the light-emitting layer 13. In the light-emitting functional layer 33, the light-emitting layer 33A may be formed between the light-emitting layer 13 and the p-type semiconductor layer 15. Specifically, the quantum well layer WB that emits light whose wavelength is shorter than that of the light-emitting layer 13 should be formed between the n-type semiconductor layer 12 and the light-emitting layer 13 or between the light-emitting layer 13 and the p-type semiconductor layer 15, or both.

The case in which the electron blocking layer 14 is formed between the light-emitting functional layers (light-emitting layers) 13, 13A, and 33 and the p-type semiconductor layer 15 is described above. However these embodiments are not limited to the case of providing the electron blocking layer 14. For example, the p-type semiconductor layer 15 may be formed on the light-emitting functional layer 13. Note that the electron blocking layer 14 has a greater band gap than those of the n-type semiconductor layer 12, the light-emitting functional layer 13, and the p-type semiconductor layer 15. Therefore, an electron can be prevented from overflowing to the side of the p-type semiconductor layer 15 across the light-emitting functional layer 13. Accordingly, it is preferable to provide the electron blocking layer 14 for large-current driving and high-temperature operation.

The first embodiment, the first and second modified examples, and the second embodiment may be combined with each other. For example, a light-emitting functional layer may be formed from the light-emitting layer 13A and the light-emitting layer 33A. Also, the light-emitting layers 13 and 13A may be laminated.

According to this embodiment and its modified example, the light-emitting layer 13 has the base layer BL with a plurality of the base segments BS that have a composition subject to stress strain from the n-type semiconductor layer 12 and are formed in a random net shape, and a quantum well structure layer that is formed from at least one quantum well layer WA and at least one barrier layer WB formed on the base layer BL. Furthermore, each quantum well layer WA has an InGaN composition and is configured so that the In composition increases as the distance to the p-type semiconductor layer 15 decreases. Accordingly, it is possible to provide a light-emitting element that can emit light with a high level of light-emitting intensity over a wide range of the visible region.

These embodiments are described with reference to the case in which the first conductivity type is an n-conductivity type and the second conductivity type is a p-conductivity type. However, the first conductivity type may be a p-type, and the second conductivity type may be an n-type.

REFERENCE SIGNS LIST 10, 10A, 10B, 30 light-emitting element
12 n-type semiconductor layer (first semiconductor layer)
13, 13A, 33, 33A light-emitting functional layer (light-emitting layer)
WA, WAA quantum well layer
WA1, WA2 well layer
14 electron blocking layer
15 p-type semiconductor layer (second semiconductor layer)
BL, BLA base layer
BL1 first sub-base layer
BL2 second sub-base layer
BS base segment
GR groove

The invention claimed is:

1. A semiconductor light-emitting element comprising:
a first semiconductor layer of a first conductivity type;
a light-emitting functional layer including a light-emitting layer formed on the first semiconductor layer; and
a second semiconductor layer that is formed on the light-emitting functional layer and is of a conductivity type opposite to that of the first semiconductor layer, wherein:
the light-emitting layer includes a base layer with a plurality of base segments that have a composition subject to strain from the first semiconductor layer and are formed in a random net shape, and a quantum well structure layer formed from at least one quantum well layer and at least one barrier layer that are formed on the base layer,
the at least one quantum well layer has an InGaN composition and is configured such that an In composition thereof increases as a distance to the second semiconductor layer decreases, and
the at least one quantum well layer is configured so that the In composition thereof increases in a stepwise manner as the distance to the second semiconductor layer decreases.

2. The semiconductor light-emitting element according to claim 1, wherein the base layer includes:
a first sub-base layer having an AlGaN composition; and
a second sub-base layer that is formed closer to a side of the second semiconductor layer than the first sub-base layer is and is formed from AlGaN having a greater Al composition than that of the first sub-base layer.

3. The semiconductor light-emitting element according to claim 1, wherein the light-emitting functional layer further includes another quantum well layer that emits light whose wavelength is shorter than that of the light-emitting layer and is disposed between the light-emitting layer and the first semiconductor layer or between the light-emitting layer and the second semiconductor layer.

4. The semiconductor light-emitting element according to claim 1, wherein the plurality of base segments are partitioned by groove portions with random and different groove lengths.

5. The semiconductor light-emitting element according to claim 4, wherein the at least one quantum well layer has recess portions corresponding to the groove portions.

6. The semiconductor light-emitting element according to claim 4, wherein a surface of the base layer comprises flattened portions and inner wall surfaces of the groove portions, and In compositions of the at least one quantum well layer on the flattened portions differ from In compositions of the at least one quantum well layer on the inner wall surfaces.

7. The semiconductor light-emitting element according to claim 4, wherein the at least one barrier layer has a GaN composition.

8. The semiconductor light-emitting element according to claim 4, wherein layer thicknesses of the at least one quantum well layer on upper surfaces of the base segments differ from layer thicknesses of the at least one quantum well layer on side surfaces of the base segments.

9. The semiconductor light-emitting element according to claim 1, wherein the plurality of base segments include base segments having upper surfaces with polygonal shapes.

10. The semiconductor light-emitting element according to claim 1, wherein the at least one barrier layer has a GaN composition.

11. The semiconductor light-emitting element according to claim 1, wherein the at least one quantum well layer has a flattened upper surface.

* * * * *